(12) United States Patent
Rezaei

(10) Patent No.: US 7,101,141 B2
(45) Date of Patent: Sep. 5, 2006

(54) SYSTEM FOR HANDLING MICROELECTRONIC DIES HAVING A COMPACT DIE EJECTOR

(75) Inventor: Frederick F. Rezaei, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 327 days.

(21) Appl. No.: 10/404,813

(22) Filed: Mar. 31, 2003

(65) Prior Publication Data

US 2004/0191034 A1     Sep. 30, 2004

(51) Int. Cl.
*H01L 21/68* (2006.01)
(52) U.S. Cl. .............................. 414/416.01; 29/426.6; 156/584
(58) Field of Classification Search ........... 414/416.01; 156/584; 29/426.6
See application file for complete search history.

(56) References Cited

U.S. PATENT DOCUMENTS

| | | | | |
|---|---|---|---|---|
| 4,221,533 A | * | 9/1980 | Heim et al. ............... | 414/744.4 |
| 4,797,994 A | * | 1/1989 | Michaud et al. ............... | 29/720 |
| 5,839,187 A | * | 11/1998 | Sato et al. ..................... | 29/743 |
| 6,132,161 A | * | 10/2000 | Shih et al. ............. | 414/416.01 |
| 6,139,676 A | * | 10/2000 | Fernandez .................. | 156/344 |
| 6,290,805 B1 | * | 9/2001 | Freund et al. ............... | 156/344 |
| 6,461,938 B1 | * | 10/2002 | Nakabayashi ................ | 438/458 |
| 6,543,513 B1 | * | 4/2003 | Lau et al. ..................... | 156/540 |
| 6,555,418 B1 | * | 4/2003 | Kurosawa et al. .......... | 438/118 |
| 6,561,743 B1 | * | 5/2003 | Nakatsu ....................... | 414/403 |
| 6,629,553 B1 | * | 10/2003 | Odashima et al. .......... | 156/584 |
| 6,792,676 B1 | * | 9/2004 | Haji et al. ..................... | 29/832 |
| 6,830,989 B1 | * | 12/2004 | Shida et al. ................ | 438/460 |
| 6,981,312 B1 | * | 1/2006 | Rezaei ......................... | 29/740 |
| 6,999,184 B1 | * | 2/2006 | Yakiyama et al. .......... | 356/614 |

FOREIGN PATENT DOCUMENTS

JP         4-65858        *   3/1992

* cited by examiner

*Primary Examiner*—Thomas J. Brahan
(74) *Attorney, Agent, or Firm*—Blakely, Sokoloff, Taylor & Zafman LLP

(57) ABSTRACT

According to one aspect of the invention, a system for handling microelectronic dies is provided. Two vertical supports are secured to the frame of the die handler. A wafer support, to support a semiconductor wafer, is mounted between the vertical supports such that the wafer can rotate about its central axis. An ejector arm track is mounted between the vertical supports below the wafer. An ejector arm is mounted to the track for rotation about the central axis of the wafer, and an ejector head is mounted to the ejector arm for translational movement along the ejector arm. A pick arm track is mounted between the vertical supports above the wafer. A pick arm is mounted to the track for rotation about the central axis of the wafer, and a pick head is mounted to the pick arm for translational movement along the pick arm.

27 Claims, 6 Drawing Sheets

SYSTEM FOR HANDLING MICROELECTRONIC DIES HAVING A COMPACT DIE EJECTOR

BACKGROUND OF THE INVENTION

1). Field of the Invention

Embodiments of this invention relate to the field of semiconductor chip processing and more particularly to an apparatus used in semiconductor chip processing.

2). Discussion of Related Art

Integrated circuits are formed on circular semiconductor wafers. The wafers are placed on sheets with adhesive on them and then sawed between the integrated circuits to form semiconductor chips also known as microelectronic dies.

The sawed wafers are then placed in a handling machine that include a die ejector and a pick and place subsystem. The die ejector has as ejector head which separates each microelectronic die from the adhesive sheet, which is then picked from the sheet and then placed on an integrated circuit board by the pick and place subsystem. The die ejector has X-arms and Y-arms to move the ejector head in an X/Y coordinate system.

One disadvantage of this system is that in order for the ejector head to be able to reach every microelectronic die on the wafer, the X and Y-arms must cover a square area into which the wafer can fit. Thus, the die ejector is larger than necessary and space on the handling machine is wasted. Another disadvantage is that movement of the ejector head in the X/Y coordinate system does not allow the ejector head to move from one die to the next die in an efficient manner. Thus, the rate at which the die ejector can work is not maximized.

BRIEF DESCRIPTION OF THE DRAWINGS

The invention is described by way of example with reference to the accompanying drawings, wherein.

DETAILED DESCRIPTION OF THE INVENTION

FIG. 1a to FIG. 6 of the accompanying drawings illustrate a system for handling microelectronic dies. Two vertical supports are secured to the frame of the die handler. A wafer support, to support a semiconductor wafer, is mounted between the vertical supports such that the wafer can rotate about its central axis. An ejector arm track is mounted between the vertical supports below the wafer. An ejector arm is mounted to the track for rotation about the central axis of the wafer, and an ejector head is mounted to the ejector arm for translational movement along the ejector arm. A pick arm track is mounted between the vertical supports above the wafer. A pick arm is mounted to the track for rotation about the central axis of the wafer, and a pick head is mounted to the pick arm for translational movement along the pick arm.

Figure 1A:
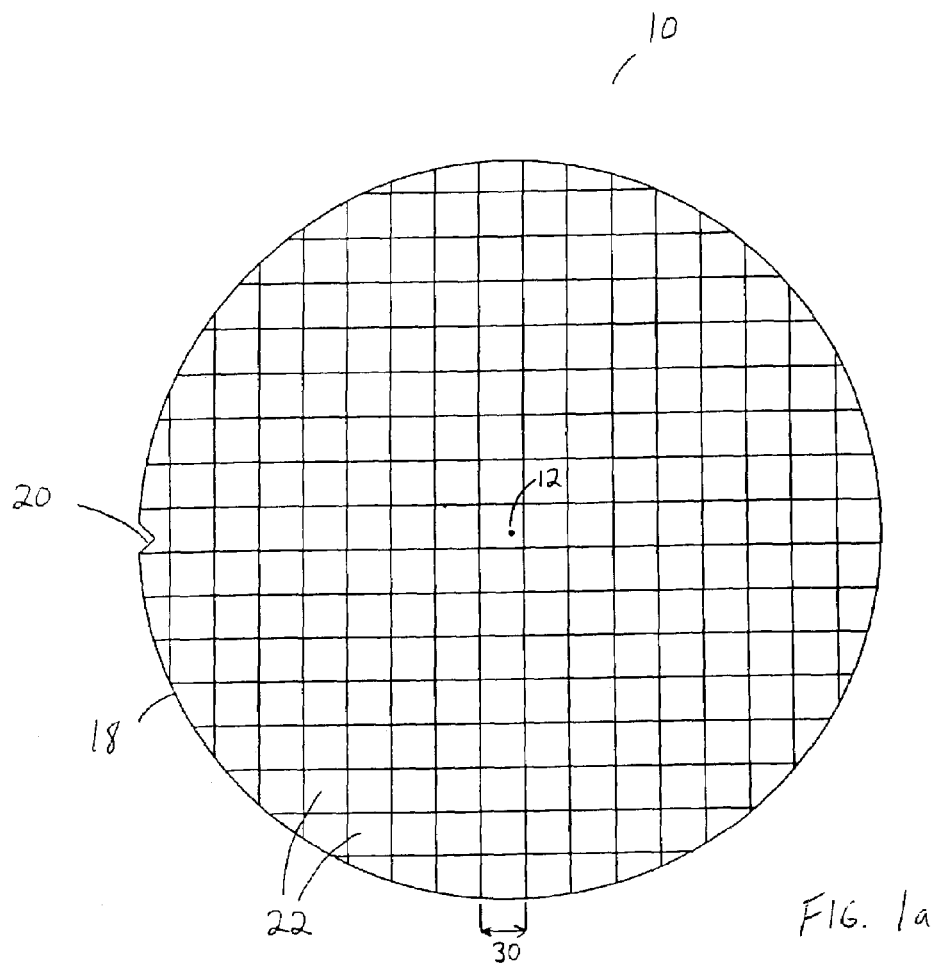
FIG. 1a is a top plan view of a typical silicon semiconductor wafer.
Figure 1B:
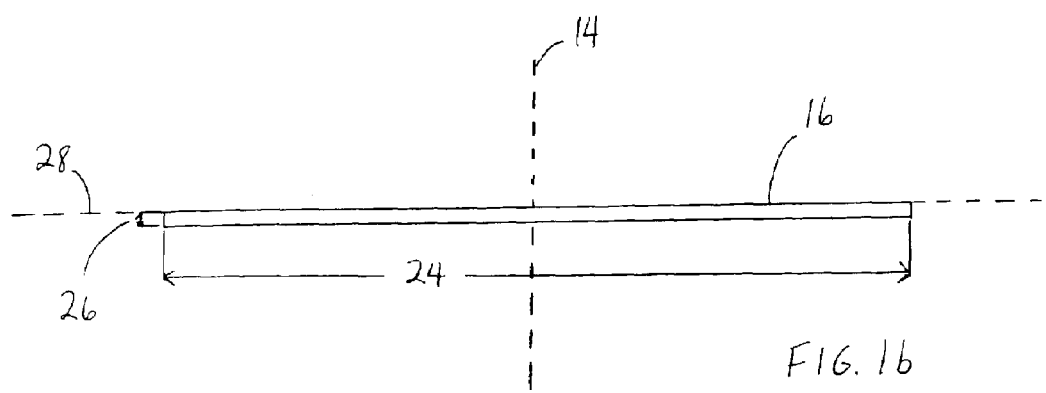
FIG. 1b is a cross-sectional side view of the wafer.

FIGS. 1a and 1b illustrate a typical semiconductor wafer 10. The semiconductor wafer 10 is made of silicon and has a center 12, a central axis 14, an upper surface 16, an outer edge 18, a notch 20, and a plurality of integrated circuits 22 formed thereon. The outer edge 18 is circular in shape with a diameter 24 of 300 mm and a thickness 26 of 100 microns. The notch 20 is formed on the outer edge 18 of the wafer 10. The upper surface 16 is flat and lies in a plane 28 extending beyond the outer edge 18 of the wafer 10. The central axis 14 intersects and is perpendicular to the upper surface 16 of the wafer 10 and the plane 28 at the center 12 of the wafer 10.

The integrated circuits 22 are square with sides 30 of, for example, 20 mm. To separate the integrated circuits 22, the wafer 10 is sawed, or diced, between the integrated circuits 22 to form semiconductor chips also known as microelectronic dies.

Figure 2:
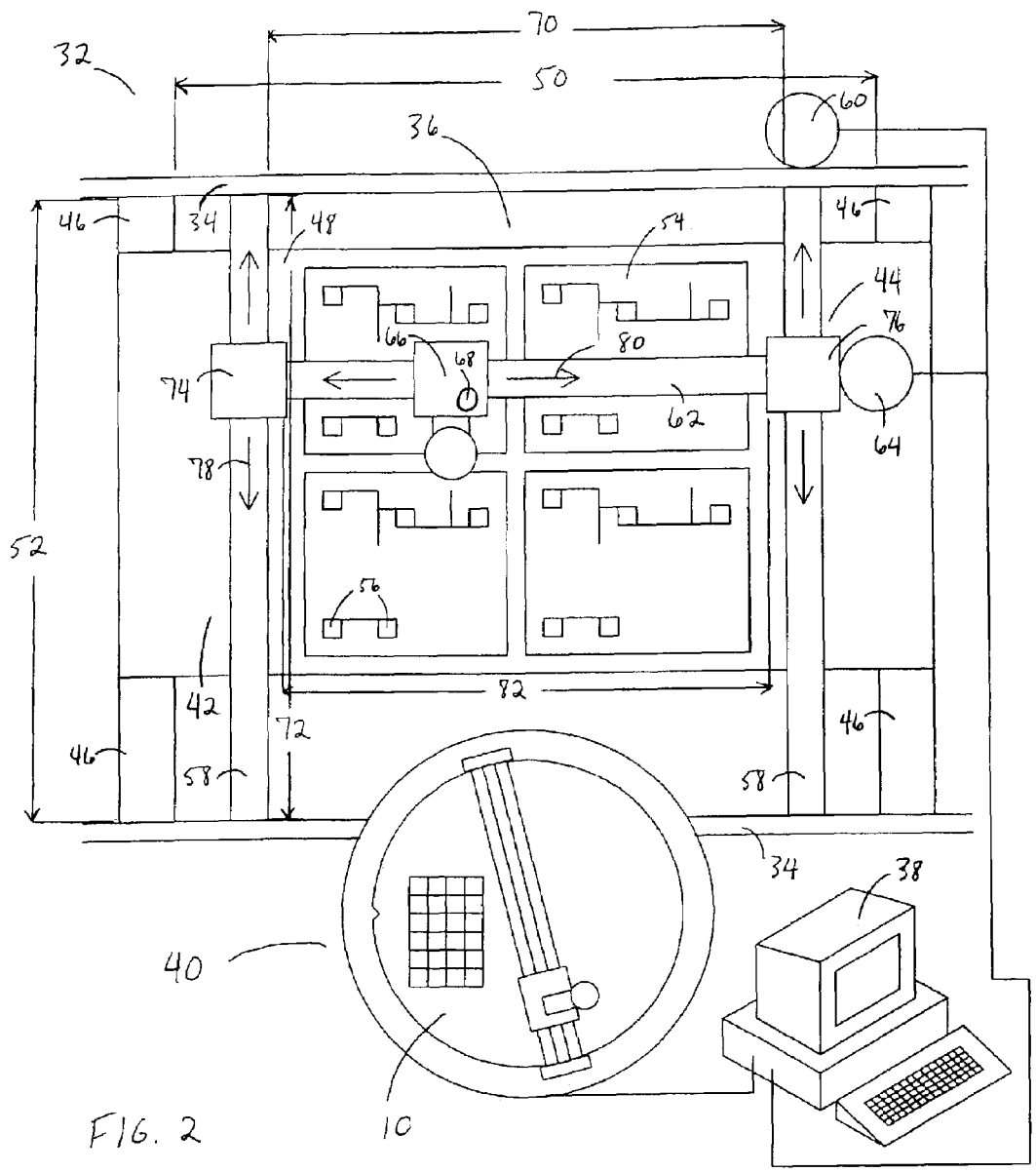
FIG. 2 is a top plan view of a microelectronic die handling system including a pick-and-place subsystem and compact die ejector.

FIG. 2 illustrates a system for handling microelectronic dies 32. The system for handling microelectronic dies 32 includes a frame 34, a pick-and-place subsystem 36, a computer control console 38, and a compact die ejector 40. The sawed, or diced, wafer 10 has been placed into the compact die ejector 40.

The pick-and-place subsystem 36 includes a transportation system 42 and a pick-and-place mechanism 44.

The transportation system includes rollers 46 and a conveyor belt 48. The rollers 46 are mounted to the frame 34 at opposing ends thereof at a distance 50 of 600 mm. Each roller 46 has a length 52 of 800 mm. The conveyor belt 48 runs over the rollers 46. Four circuit boards 54, substrates, or dies lie on the conveyor belt 48, and each circuit board 54 includes a plurality of selected formations 56. The selected formations 56 are each shaped to fit one of the microelectronic dies.

The pick-and-place mechanism 44 includes actuators in the form of two Y-arms 58, a Y-direction motor 60, an X-arm 62, and X-direction motor 64, a pick-and-place head 66, and a pick-and-place head motor 68.

The Y-arms 58 are mounted to the frame 34 at opposing ends thereof and extend over the conveyor belt 48 at distance 70 of 600 mm. The Y-arms 58 have a length 72 of 800 mm. The X-arm 62 is connected to the Y-arms 58 at opposing ends thereof by first 74 and second 76 XY junctions which are mounted to the Y-arms 58 such that the X-arm 62 may translate in a Y direction 78 between the Y-arms 58. The X-arm 62 extends over the conveyor belt 48 across the circuit boards 54. The Y-direction motor 60 is mounted to the frame 34 and connected to the second XY junction 76. The pick-and-place head 66 is mounted to the X-arm 62 and is suspended over the circuit boards 54. The pick-and-place head 66 is mounted to the X-arm 62 so that it may translate in an X direction 80 between the Y-arms 58 along the X-arm 62 and move vertically to and from the conveyor belt, transverse to the plane 28. The X-direction motor 64 is mounted to the second XY junction 76 and connected to the pick-and-place head 66. The X-arm 62 has a length 82 of 600 mm. The pick and place head motor 68 is mounted to the pick and place head 66 and connected to the X-arm 62.

The computer control system 38 is electronically connected to the X-direction motor 64, the Y-direction motor 60, and the compact die ejector 40. The computer control system 38 is in the form of a computer having memory for storing a set of instructions and a processor connected to the memory for executing the instructions, as is commonly understood.

Figure 3:
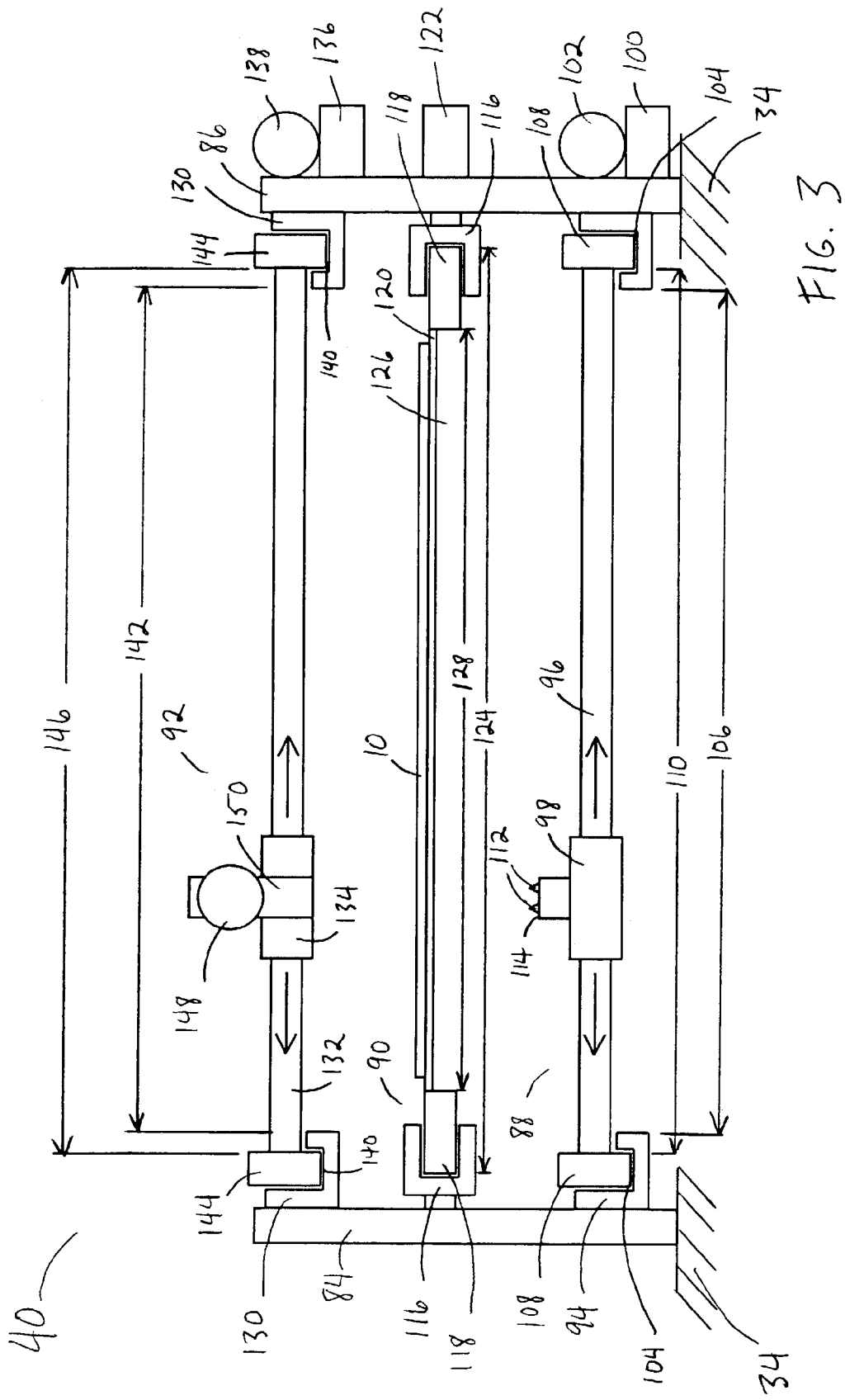
FIG. 3 is a side view of the compact die ejector.
Figure 4:
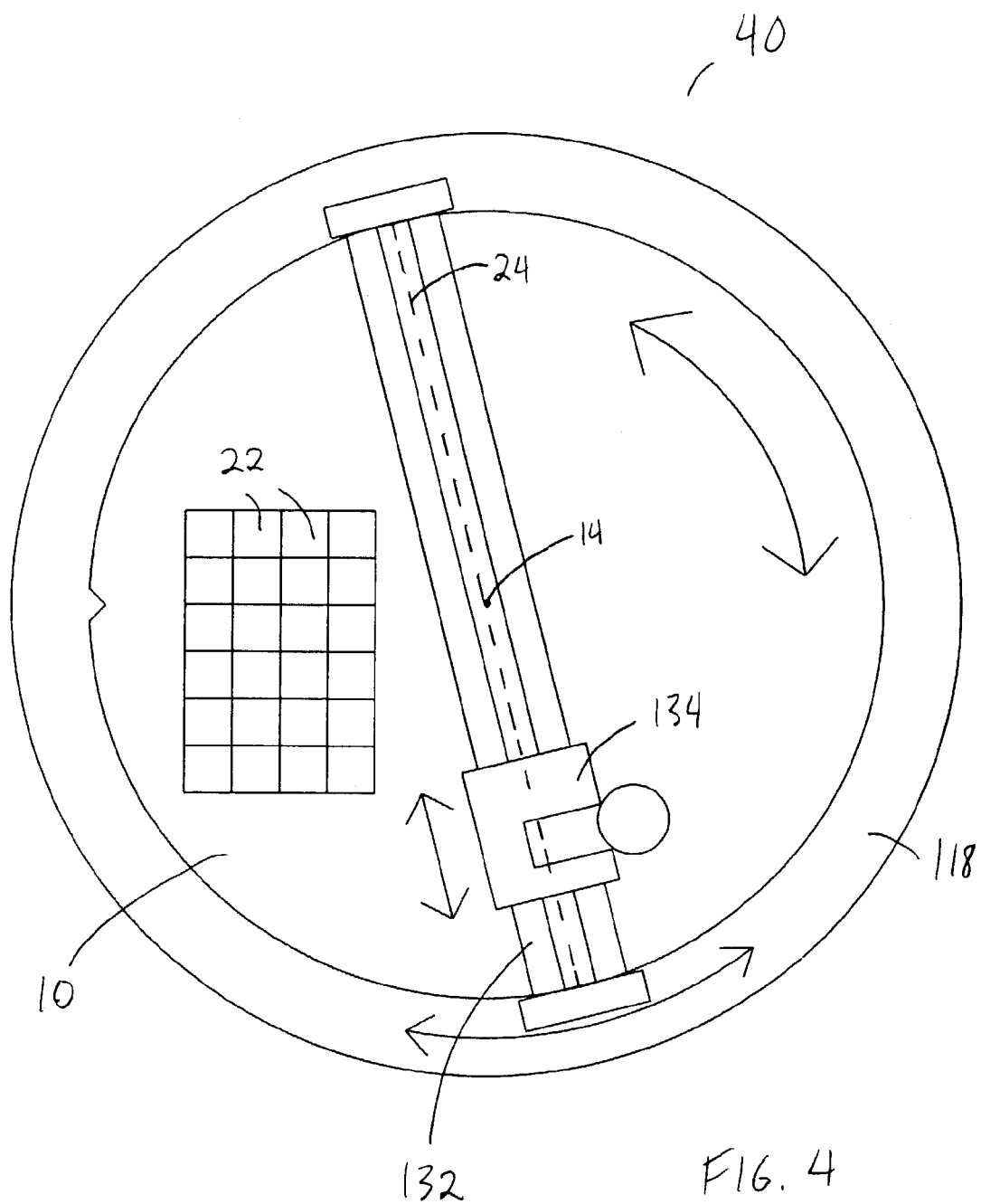
FIG. 4 is a top plan view of the compact die ejector.

Referring to FIGS. 3 and 4, the compact die ejector 40 includes first 84 and second 86 vertical supports, an ejecting mechanism 88, a wafer support 90, and a picking mechanism 92. The vertical supports are secured to the frame 34 and extend in a vertical direction.

The ejecting mechanism 88 includes an ejector arm track 94, an ejector arm 96, an ejector head 98, and actuators in the form of an ejector arm motor 100 and an ejector head motor 102.

The ejector arm track 94 is secured between the vertical supports at opposing sides thereof. The ejector arm track 94 is circular and has a cross-section shaped to form a plurality of U-shaped channel portions 104. The ejector arm track 94 has diameter 106 of approximately 300 mm. The ejector arm 96 has ends 108 which rest in the channel portions 104 of the ejector arm track 94. The ejector arm 96 extends across the diameter 106 of the ejector arm track 94 and has a length 110 of approximately 300 mm. The ejector head 98 is mounted to the ejector arm 96 so that it may translate along the length 110 of the ejector arm 96. The ejector head 98 houses pins 112 which protrude from an upper surface 114 thereof. The ejector arm motor 100 is mounted to the second vertical support 86 and is connected to the ejector arm 96. The ejector head motor 102 is secured to the second vertical support 86 and connected to the ejector head 98.

The wafer support 90 includes rails 116, a wafer plate 118, an adhesive sheet 120, and a wafer support motor 122.

The rails 116 are mounted between and to the vertical supports and are in the form of semicircular "C's," facing each other. The wafer plate 118 is housed within the rails 116, and has a circular shape with a diameter 124 of approximately 400 mm. The wafer plate 118 has a hole 126 with a diameter 128 of 350 mm across which the adhesive sheet 120 is stretched. The wafer 10 is placed on the adhesive sheet 120 and the entire wafer 10 lies above the hole 126. The wafer support motor 122 is mounted to the second vertical support 86 and is connected to the wafer plate 118. The wafer support 90 extends across the vertical supports and lies above the ejector arm 96.

The picking mechanism 92 includes a pick-arm track 130, a pick arm 132, a pick head 134, a pick-arm motor 136, and a pick-head motor 138.

The pick-arm track 130 is secured between the vertical supports at opposing sides thereof. The pick-arm track 130 is circular and has a cross-section shaped to form a plurality of U-shaped channel portions 140. The pick-arm track 130 has a diameter 142 of approximately 300 mm. The pick arm 132 has ends 144 which rest in the channel :portions 140 of the pick-arm track 130. The pick arm 132 extends across the diameter 142 of the pick-arm track 130 and has a length 146 of approximately 300 mm. The pick head 134 is mounted to the pick arm 132 so that it may translate along the length 146 of the pick arm 132. The pick-arm motor 136 is mounted to the second vertical support 86 and connected to the pick arm 132. The pick head 134 is mounted to the pick arm 132 to translate along the length 146 of the pick arm 132. The pick-head motor 138 is connected to the pick head 134. The pick head includes a pick piece 148 and a flipping mechanism 150 to flip the pick piece 148.

The pick arm 132 extends directly over and across the diameter 24 of the wafer 10 and is mounted to the pick-arm track 130 so that it may rotate about the central axis 14 of the wafer 10. Similarly, the ejector arm 96 extends directly beneath and across the diameter 24 of the wafer 10 and is mounted to the ejector arm track 94 so that it may rotate about the central axis 14 of the wafer 10 independent of the wafer plate 118 and the pick arm 132. The pick head 134 is mounted to the pick arm 132 so that it may translate along the pick arm length 146 and across the diameter 24 of the wafer 10. Similarly, the ejector head 98 is mounted to the ejector arm 96 so that it may translate along the ejector arm length 110 and across the diameter 24 of the wafer 10. The wafer plate 118 is mounted to the rails 116 so that it may rotate about the central axis 14 of the wafer 10 independent of the pick arm 132 and the ejector arm 96. The wafer 10 rotates with the wafer plate 118.

Figure 5A:
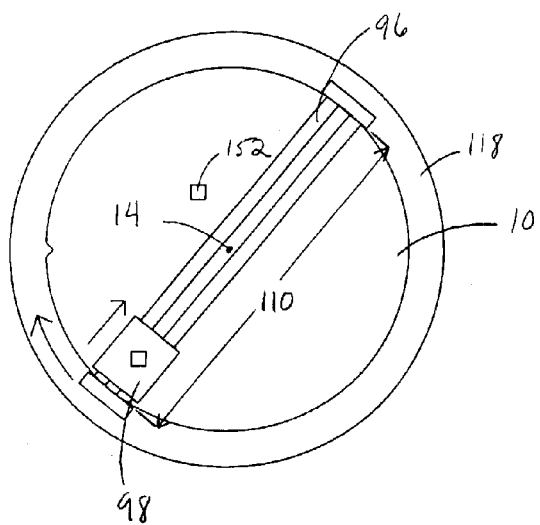
FIG. 5a is a bottom view of the compact die ejector.
Figure 5B:
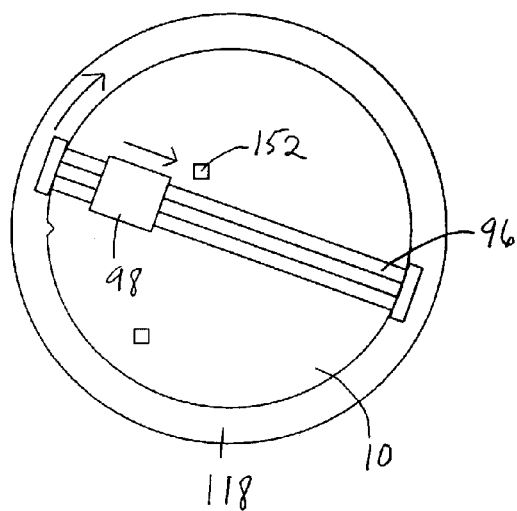
FIG. 5b is a bottom view of the compact die ejector.
Figure 5C:
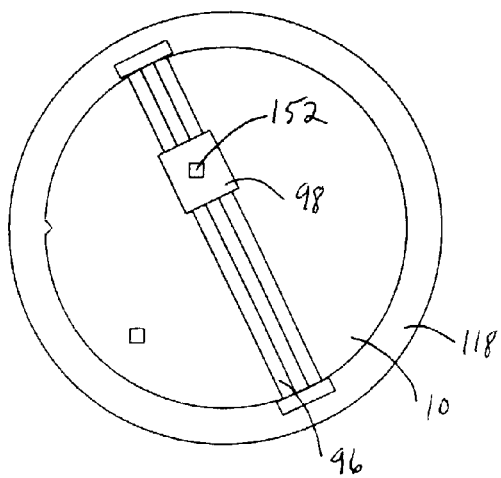
FIG. 5c is a bottom view of the compact die ejector.

In use, after the wafer 10 has been sawed completely through to form singulated microelectronic dies, the computer control console selects a microelectronic die 152 to be ejected from the wafer 10. FIGS. 5A, 5B, and 5C, illustrate how the ejector head 98 moves relative to the wafer. After the computer has selected a microelectronic die 152, the ejector head 98 begins to move from its current location to a position beneath the selected microelectronic die 152 suitable to eject the die 152. The ejector head is moved in a circular coordinate system as the ejector arm 96 rotates about the central axis 14 of the wafer 10 and the ejector head 98 translates along the length 110 of the ejector arm 96 towards the central axis 14 of the wafer 10. Once the ejector arm 96 has rotated, and the ejector head 98 has translated enough, the motion stops as the ejector head 98 is in the position that is suitable to eject the selected microelectronic die 152. The pick arm 132 and pick head 134 move in unison with the ejector arm 96 and ejector head 98.

Figure 6:
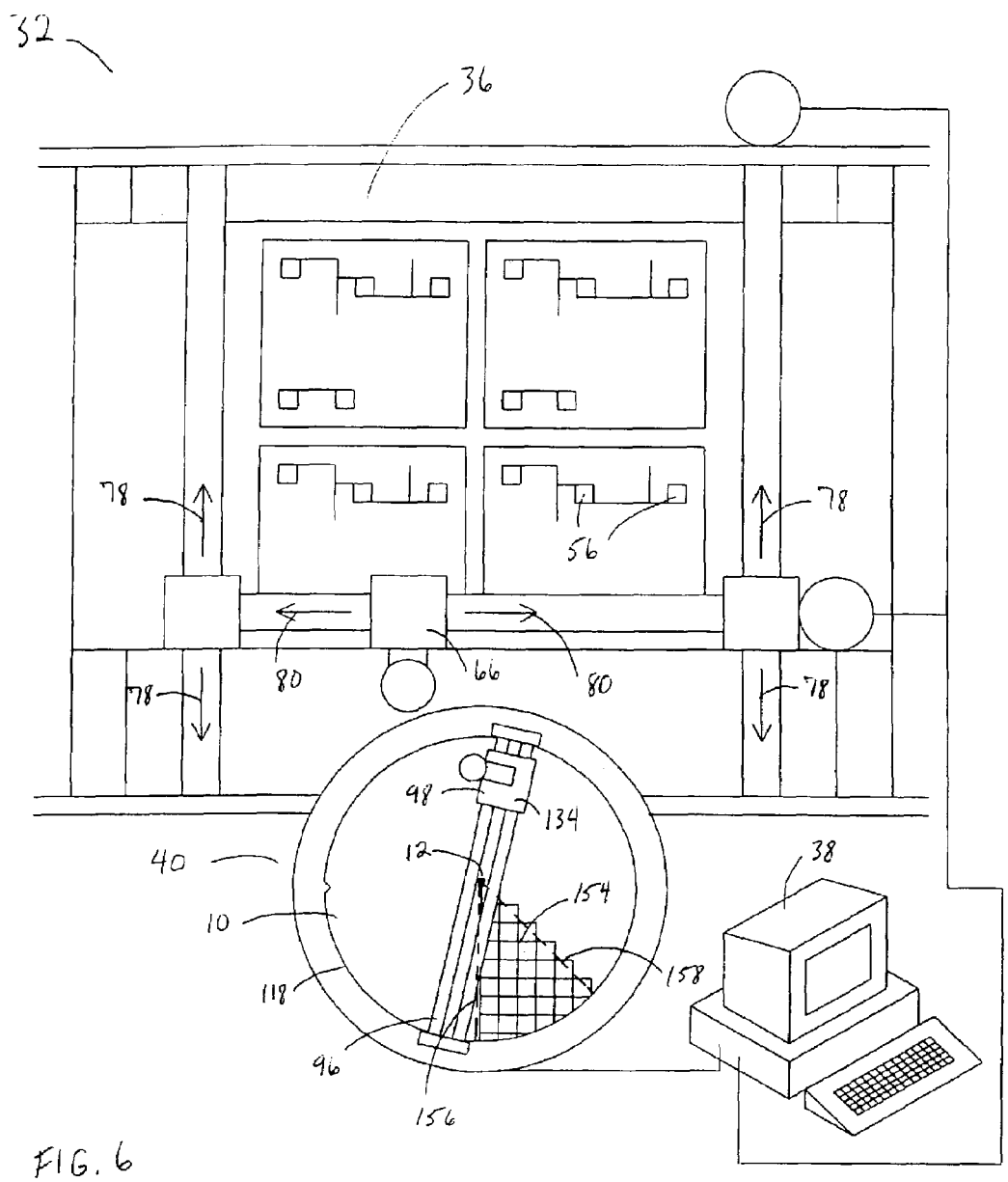
FIG. 6 illustrates a top plan view of the microelectronic die handling system.

After the ejector head 98 has ejected the selected microelectronic die 152, the pick head 134 picks the die 152 from the ejector head 98. The pick head 134 then flips the die 152 into a flipped position. As shown in FIG. 6, the pick head 134 then moves the die 152 into a proximate position relative to the pick-and-place subsystem 36 so that the pick-and-place head 66 can pick the die 152 from the pick head 134. Moving in an X/Y coordinate system, the pick-and-place head 66 then picks the die 152 from the pick head 134 and places the die 152 into one of the selected formations 56 on one of the circuit boards 54. The control computer 38 then selects another microelectronic die to be ejected, and the process is repeated for the other die which is placed into different socket 56. In order to maximize the efficiency of the compact die ejector 40, the computer 38 selects a portion 154 or a "slice" of the wafer 10, defined by a first 156 and second line 158 extending from the center 12 of the wafer 10 to the outer edge 18 of the wafer 10. The computer 38 then commands the compact die ejector 40 to eject and pick all the microelectronic dies in the portion 154 before moving on to the microelectronic dies not in the portion 154. Dividing the wafer 10 into such slices 154 minimizes the movements needed by the ejector arm 96 and ejector head 98 and increases the output of the system.

One advantage is that a more compact die ejector is provided because very little structure is needed beyond the outer edge of the wafer as the ejector and pick arms are of a length approximately the same as the diameter of the wafer and the ejector and pick arms rotate about the central axis of the wafer so that they never go beyond the outer edge of the wafer. Another advantage is that the pick speed is increased and the motors involved undergo less wear because using a circular coordinate system to eject dies from a circular wafer maximizes the efficiency of the movements of the ejector head.

Other embodiments of the invention may not have the ejector arm, the wafer support, and the pick arm able to rotate independently of each other. The ejector arm and the pick arm may be connected such that they rotate together. The ejector arm and/or the pick arm may be stationary while only the wafer support rotates the wafer while the ejector head and the pick head translate along their respective arms. Conversely, the wafer support may be stationary while the ejector arm and/ or the pick arm rotate while the ejector head and pick head translate along their respective arms. The entire picking mechanism of the compact die ejector may not be necessary at all. The pick and place subsystem may pick the dies directly from the ejector head if it is desired not to have the dies in a flipped position when picked by the pick and place subsystem. Wafers of other sizes, such as one with a 200 mm diameter, may also be used in the compact die ejector.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

The invention claimed is:

1. A system for ejecting a microelectronic die from a wafer, comprising:
  a frame;
  a wafer support mounted to the frame to support a diced wafer relative to the frame in a position such that the wafer has a major surface comprising microelectronic dies in a select plane;
  an ejector arm mounted to the frame, the ejector arm being rotatable relative to the wafer support about an axis through the plane;
  a means for rotating the ejector arm about the axis;
  an ejector head mounted for translating along the ejector arm; and
  a means for translating the ejector head along the ejector arm, said rotation and translation moving the ejector head from a first position next to the wafer to a second position next to the wafer, the second position being suitable to eject a selected microelectronic die from the wafer.

2. The system of claim 1, wherein the wafer support is rotatable about the axis and wherein the system further comprises a means for rotating the wafer support about the axis.

3. The system of claim 2, further comprising:
  a pick arm mounted to the frame, the pick arm being rotatable relative to the wafer support about the axis through the plane;
  a means for rotating the pick arm about the axis;
  a pick head mounted for translating along the pick arm; and
  a means for translating the pick head along the pick arm, said rotation and translation moving the pick head from a first position next to the wafer to a second position next to the wafer, the second position being suitable to pick the selected microelectronic die from the ejector head.

4. The system of claim 3, further comprising a means for controlling said rotations and translations such that the ejector head is in the second position when the pick head is in the second position.

5. A system for handling microelectronic dies, comprising:
  a frame;
  a wafer support mounted to the frame to support a diced wafer relative to the frame in a position such that the wafer has a major surface and comprising microelectronic dies in a select plane;
  an ejector arm mounted to the frame, the ejector arm being rotatable relative to the wafer about an axis through the plane;
  an ejector arm actuator secured to the frame and connected to the ejector arm to cause the ejector arm to rotate about the axis;
  an ejector head mounted for translating along the ejector arm; and
  an ejector head actuator secured to the ejector arm and connected to the ejector head to cause the ejector head to translate along the ejector arm, said rotation and translation moving the ejector head from a first position next to the wafer to a second position next to the wafer, the second position being suitable to eject a selected microelectronic die from the wafer.

6. The system of claim 5, further comprising an ejector arm track mounted to the frame, the ejector arm being rotatable secured thereto.

7. The system of claim 6, wherein the ejector arm has two ends secured to the ejector track, the two ends rotating in unison around the track.

8. The system of claim 7, wherein the ejector arm track is circular with a diameter of approximately 300 mm and the ejector arm has a length of approximately 300 mm.

9. The system of claim 8, wherein the axis is through a mid-point of the length of the ejector arm.

10. The system of claim 9, wherein the axis is perpendicular to the plane.

11. The system of claim 10, wherein the axis is a central axis of the wafer.

12. The system of claim 11, further comprising a pick and place subsystem comprising:
  a Y-arm mounted to the frame;
  an X-arm mounted for translating along the Y-arm;
  a Y-direction actuator secured to the Y-arm and connected to the X-arm to cause the X-arm to translate along the Y-arm in a Y direction;
  a pick and place head mounted for translating along the X-arm; and
  an X-direction actuator secured to the X-arm and connected to the pick and place head to cause the pick and place head to translate along the X-arm in an X-direction, said translations moving the pick and place head from a third position away from the wafer to a fourth position near the wafer, the fourth position being suitable to pick the selected wafer from the ejector head.

13. The system of claim 12, further comprising a computer in communication with the actuators to control said rotations and translations.

14. The system of claim 13, wherein the wafer support is rotatable about the axis and further comprises a wafer actuator secured to the frame and connected to the wafer support to cause the wafer support to rotate about the axis.

15. The system of claim 14, further comprising:
  a pick arm mounted to the frame, the pick arm being rotatable relative to the wafer support about the axis;
  a pick arm actuator secured to the frame and connected to the pick arm to cause the pick arm to rotate about the axis;
  a pick head mounted for translating along the pick arm; and
  a pick head actuator secured to the pick arm and connected to the pick head to cause the pick head to translate along the pick arm, said rotation and translating moving the pick head from a first position next to the wafer to a second position next to the wafer, the second position being suitable to pick the selected microelectronic die from the ejector head.

16. The system of claim 15, further comprising a pick arm track mounted to the frame, the ejector arm being rotatable secured thereto.

17. The system of claim 16, wherein the pick arm has two ends secured to the ejector track, the two ends rotating in unison around the track.

18. The system of claim 17, wherein the pick arm track is circular with a diameter substantially the same as the diameter of the ejector arm track, and the pick arm has a length substantially the same as the length of the ejector arm.

19. The system of claim 18, wherein the axis is through a mid-point of the length of the pick arm.

20. The system of claim 19, wherein the pick head is rotatable about a second axis not through the plane and further comprising a flip actuator secured to the pick arm and connected to the pick head to cause the pick head to rotate about the second axis, said rotation moving the selected microelectronic die to a flipped position.

21. The system of claim 20, wherein the fourth position is suitable for the pick and place head to pick the selected microelectronic die from the pick head at the flipped position.

22. The system of claim 21, wherein the computer controls the actuators such that the ejector head is in the second position, the pick head is in the flipped position when the ejector head is in the second position, and the pick and place head is in the fourth position when the ejector head is in the second position.

23. The system of claim 22, wherein the actuators are electric motors connected to a common power source.

24. A system for ejecting microelectronic dies from a wafer, comprising:
   a frame;
   a wafer support mounted to the frame to support a diced wafer relative to the frame in a position such that the wafer has a major surface comprising microelectronic dies in a select plane, the wafer support being rotatable about a first axis through the plane;
   a wafer actuator secured to the frame and connected to the wafer support to cause the wafer support to rotate about the first axis;
   an ejector arm mounted to the frame, the ejector arm being rotatable relative to the wafer about a second axis through the plane;
   an ejector arm actuator having a first component and second component, the first component being secured to the frame and connected to the ejector arm to cause the ejector arm to rotate about the second axis;
   an ejector head mounted for translating along the ejector arm; and
   an ejector head actuator secured to the ejector arm and connected to the ejector head to cause the ejector head to translate along the ejector arm, said rotation and translation moving the ejector head from a first position next to the wafer to a second position next to the wafer, the second position being suitable to eject a selected microelectronic die from the wafer;
   a pick arm mounted to the frame, the pick arm being rotatable relative to the wafer about a third axis through the plane;
   a pick arm actuator secured to the frame and connected to the pick arm to cause the pick arm to rotate about the third axis;
   a pick head mounted for translating along the pick arm; and
   a pick head actuator secured to the pick arm and connected to the pick head to cause the pick head to translate along the pick arm, said rotation and translating moving the pick head from a first position next to the wafer to a second position next to the wafer, the second position being suitable to pick the selected microelectronic die from the ejector head.

25. The system of claim 24, comprising:
   a Y-arm mounted to the frame;
   an X-arm mounted for translating along the Y-arm;
   a Y-direction actuator secured to the Y-arm and connected to X-arm to cause the X-arm to translate along the Y-arm in a Y-direction;
   a pick and place head mounted for translating along the X-arm and moving transversely to the plane;
   an X-direction actuator secured to the X-arm and connected to the pick and place head to cause the pick and place head to translate along the X-arm in an X-direction, said translations moving; and
   a pick and place head actuator secured to the pick and place head and connected to the X-arm to cause the pick and place head to move transversely to the plane, said translations and transverse movements moving the pick and place head from a third position away from the wafer to a fourth position near the wafer, the fourth position being suitable to pick the selected wafer from the ejector head.

26. The system of claim 25, wherein the first, second, and third axes are perpendicular to the plane and are the same axis.

27. The system of claim 26, wherein the first, second, and third axes are along the central axis of the wafer.

* * * * *